United States Patent [19]
Dargelas

[11] Patent Number: 5,938,785
[45] Date of Patent: Aug. 17, 1999

[54] AUTOMATICALLY DETERMINING TEST PATTERNS FOR A NETLIST HAVING MULTIPLE CLOCKS AND SEQUENTIAL CIRCUITS

[75] Inventor: Alain Dargelas, Mountain View, Calif.

[73] Assignee: VLSI Technology, Inc., San Jose, Calif.

[21] Appl. No.: 08/914,431

[22] Filed: Aug. 19, 1997

[51] Int. Cl.$^6$ .................................................. G01R 31/28
[52] U.S. Cl. ...................... 714/744; 714/741; 395/555; 395/559
[58] Field of Search ...................... 395/551, 555, 395/556, 559, 500, 183.08, 183.09; 371/27.1, 27.4, 27.7, 27.5, 22.1, 22.31, 22.32, 22.33, 22.36; 364/264.3, 578

[56] References Cited

U.S. PATENT DOCUMENTS

| | | | |
|---|---|---|---|
| 5,377,197 | 12/1994 | Patel et al. | 395/500 |
| 5,528,604 | 6/1996 | El-Maleh et al. | 714/33 |
| 5,583,787 | 12/1996 | Underwood et al. | 714/731 |
| 5,781,718 | 7/1998 | Nguyen | 395/183.09 |

*Primary Examiner*—Trinh L. Tu
*Attorney, Agent, or Firm*—Wagner, Murabito & Hao

[57] ABSTRACT

A method and computer system for automatically determining test patterns for a netlist having multiple clocks and sequential circuits. The invention utilizes a static model of a sequential circuit and models the sequential circuit having multiple clock signals (e.g., one model is used for all multiple clock signals). The multiple clock signals include primary clock input signals and internal clock signals. The clock signals can be gated or dual edge. The invention makes use of the "iterative array representation of sequential circuits" (IAR) model for automatic test pattern generation (ATPG) but utilizes a static sequential circuit model. The invention receives user defined input clock signal waveforms and determines a cycle of clocks based thereon that statically represents all waveforms over time. The cycle of clocks is divided into frames where each frame contains stable clock values. The stable clock values are used to determine the values of each signal that clocks a sequential circuit of the netlist for each frame. This information is then used to determine which sequential circuits are active and which are not active for any given frame. The IAR model is then given the active/inactive information and the ATPG process uses this information to prune efficiency in the search space and search time for finding test patterns that can distinguish a particular fault. Unlike conventional ATPG processes, test pattern determination efficiency is gained in the present invention by having, in advance, the input clock signals given by the user.

20 Claims, 6 Drawing Sheets

| SEQ Element # | Frame # | | | | | | |
|---|---|---|---|---|---|---|---|
| | 0 | 1 | 2 | 3 | 4 | 5 | i |
| 0 | A | A | N/A | A | N/A | N/A | A |
| 1 | A | A | N/A | A | A | N/A | A |
| 2 | N/A | A | N/A | A | N/A | A | N/A |
| 3 | A | N/A | N/A | A | A | A | N/A |
| 4 | N/A | N/A | A | N/A | A | A | N/A |
| 5 | A | A | A | A | A | N/A | A |
| i | N/A | A | A | N/A | N/A | A | A |

FIG. 6

AUTOMATICALLY DETERMINING TEST PATTERNS FOR A NETLIST HAVING MULTIPLE CLOCKS AND SEQUENTIAL CIRCUITS

TECHNICAL FIELD

The present invention relates to the field of automatic test pattern generation (ATPG). More specifically, the present invention relates to the field of ATPG for networks having sequential circuits.

BACKGROUND ART

Integrated circuit (IC) devices are typically tested at two stages during manufacture using production tests. The silicon dies first are tested after fabrication is complete at stations called wafer test or wafer sort. Each wafer is tested, one die at a time, using an array of probes on a probe card that descends onto the bonding pads of a single die. The production tester, a complex machine, applies signals generated by a test program and measures the IC device's test response. In a production test, the only input/output pins that can be accessed are the primary inputs and the primary outputs (e.g., the package pins). A typical IC device can have several hundred primary inputs and therefore each test vector is several hundred bits in length. A test program generally applies hundreds of thousands of different test vectors or patterns at a frequency of several megahertz over several hundred milliseconds during the test session. Those IC devices that fail are then rejected. A second test is then performed after the die has been packaged. Again, those IC devices that fail are rejected.

Fabrication of an IC device is a complex process and problems in this process can introduce a defect that causes a fault in the circuit. Any problem during fabrication can prevent a transistor from operating properly and can break or join interconnections. Two common types of defects occur in metallization: either underetching the metal (a short occurs) or overetching the metal (an open circuit occurs). Defects can also occur in processes that are performed after the fabrication is complete, e.g., testing of the wafer, cutting the die from the wafer, mounting the die in a package, etc.

To test the IC device, a series of test vectors (patterns) need to be devised that test for particular faults. Fault simulation is used after logic simulation to determine the manner in which an IC device responds when a deliberately introduced fault is added at a particular point in a circuit netlist. These faults are typically stuck-at faults, e.g., stuck-at zero (0) or stuck-at one (1) where the node is always a logical 0 or a logical 1, respectively, during circuit simulation. During fault simulation, the output of the faulty netlist is compared to the output of a good netlist without introduced faults. If the outputs are different, then the selected fault is said to be a "detected fault" with respect to the netlist. The extent to which faults can be detected by a series of test vectors (e.g., a test program) for a given netlist defines the fault coverage of the test program. If a particular test program does not deliver adequate fault coverage, it is modified and fault simulation is repeated.

Automatic test pattern generation (ATPG) processes are used to devise test patterns using complex computer implemented processes. The goal of ATPG processes applicable to sequential circuits is to generate test vectors to test the maximum number of stuck-at faults in the circuit (e.g., in the netlist). See, as background, the reference by M. Abramovici, M. A. Breuer, and A. D. Friedman, entitled "Digital Systems Testing and Testable Design," available from Computer Science Press, 1990. To do so, the ATPG process for sequential circuits uses processes taken from ATPG processes that are dedicated for combinatorial circuits and applies them using a model called "Iterative Array Representation of Sequential Circuits" (IAR) as described in the Abramovici reference. See, also as background, the reference by H. Fujiwara and T. Shimon, entitled "On the Acceleration of Test Generation Algorithms," from IEEE Transaction on Computers, Volume C-32, N. 12, pp. 1137–1144, December 1983. In the IAR representation, the circuit is virtually replicated in time and every replication represents a stable state of the circuit. Transitions in between the frames (a frame denotes a single representation of the circuit) represent a clock signal toggling. The AIR representation was originally used for single clock circuits.

However, other approaches (e.g., Sunrise Test Systems reference Manual Version 1.2a/August 1993) keep the original IAR representation and increase the complexity of the sequential modeling to handle ATPG in multiple clock circuits. In this approach, additional circuitry is introduced to the sequential modeling in proportion to the number of additional clocks that are found the multiple clock circuit. Since the sequential circuit model is altered to account for the multiple clocks, this prior art approach is called a "dynamic" sequential circuit model. The additional circuitry increases geometrically as multiple clocks are added and as additional sequential circuits are used within netlists. This additional circuitry of the dynamic sequential circuit model increases the time and computer resources required to perform ATPG for netlists that contain sequential circuits and have multiple clocks.

Accordingly, what is needed is an efficient method and system for performing ATPG on netlists having sequential circuits and multiple clock signals. A further need exists for a method and system for performing ATPG on netlists having sequential circuits and multiple clock signals that does not utilize a dynamic model of the sequential circuit. Still another need exists for a method and system for performing ATPG on netlists having sequential circuits and multiple clock signals that uses the same model for sequential circuits as is used in single clock models. The present invention provides the above advantageous features and others not specifically recited above but clear within discussions of the present invention herein.

DISCLOSURE OF THE INVENTION

A method and computer system are described herein for automatically determining test patterns for a netlist having multiple clocks and sequential circuits. The invention utilizes a static model of a sequential circuit and models the sequential circuit having multiple clock signals (e.g., one model is used for all multiple clock signals). The multiple clock signals include primary input clock signals and internal clock signals. The internal clock signals can be determined using a logical simulator given the primary input clock signals. The clock signals can be gated or dual edge. The invention makes use of the "iterative array representation of sequential circuits" (IAR) model for automatic test pattern generation (ATPG) but utilizes a static sequential circuit model. The invention receives user defined primary input clock signal waveforms and determines a cycle of clocks based thereon that, when replicated, statically represents all waveforms over time. The cycle of clocks is divided into frames where each frame contains stable clock values. The stable clock values are input to the logic simulator to determine the values of each signal that clocks a sequential circuit of the netlist for each frame.

This information is then used to determine which sequential circuits are active and which are not active for any given frame. The IAR model is then given the active/inactive information and the ATPG process uses this information to efficiently prune the search space and search time for finding test patterns that can distinguish a particular fault. Unlike conventional ATPG processes, test pattern determination efficiency is gained in the present invention by having, in advance, the input clock signals given by the user. In effect, the clock waveforms are given by the user and the ATPG process is then constrained to find a test sequence given a particular clock waveform. In one embodiment, the clock waveforms can be supplied by the user in a computer system file format.

Specifically, an embodiment of the present invention includes a computer implemented method of generating test patterns for a circuit represented by a netlist and having clock signals, sequential circuits and combinatorial logic, the computer implemented method having the steps of: a) receiving predefined input clock signals and determining multiple clock signals therefrom; b) determining a cycle of clocks based on cycles of each clock signal of the multiple clock signals, the cycle of clocks representing a shortest pattern that when replicated yields all of the multiple clock signals; c) dividing the cycle of clocks into multiple time frames wherein all of the multiple clock signals are stable within each time frame, the step c) generating a set of stable values of the multiple clock signals for each time frame; d) using a logic simulator, determining the clock signal input of each sequential circuit within the netlist for each time frame, the step d) using as input a set of stable values of the multiple clock signals for each time frame; e) for each time frame, determining which of the sequential circuits are active and which of the sequential circuit are inactive in the time frame and generating a data structure in a computer memory for all time frames; and f) using an automatic test pattern generator, constrained by the data structure and the multiple clock signals, to determine the test patterns, the test patterns for distinguishing a particular fault within the netlist.

Further embodiments of the present invention include the above method and wherein the automatic test pattern generator utilizes an iterative array representation of sequential circuits model comprising combinatorial logic states separated by columns of modeled sequential elements for each time frame and wherein individual columns of modeled sequential elements contain subsets of active sequential elements and subsets of inactive sequential elements and wherein further step f) comprises the step of the automatic test pattern generator propagating sequential circuit inputs to sequential circuit outputs only for active sequential elements of the netlist within the iterative array representation of sequential circuits model.

These and other advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 6 is a matrix-configured data structure storing information indicating whether sequential elements are active or inactive during selected frames of various clock cycles in accordance with one embodiment of the present claimed invention.

BEST MODE FOR CARRYING OUT THE INVENTION

Figure 1:
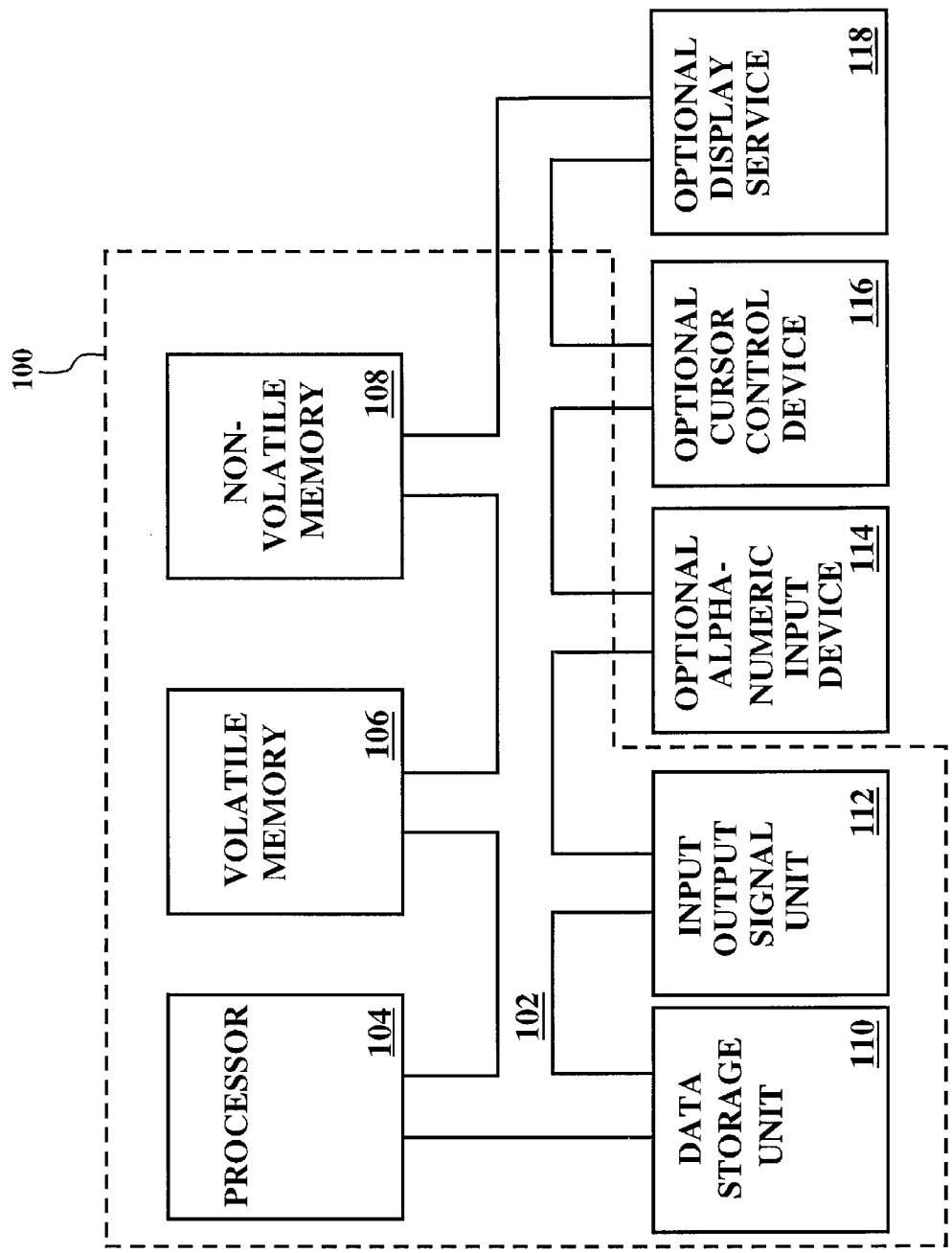
FIG. 1 is a schematic diagram of an exemplary computer system used to perform the low capacitance diffusion pattern method in accordance with one embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proved convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving", "determining", "dividing", "using", or the like, refer to the actions and processes of a computer system, or similar electronic computing device.

The computer system or similar electronic computing device manipulates and transforms data represented as physical (electronic) quantities within the computer system's registers and memories into other data similarly represented as physical quantities within the computer system memories or registers or other such information storage, transmission, or display devices. The present invention is also well suited to the use of other computer systems such as, for example, optical and mechanical computers.

COMPUTER SYSTEM ENVIRONMENT OF THE PRESENT INVENTION

With reference now to FIG. 1, portions of the present automatic test pattern generation (ATPG) method are comprised of computer-readable and computer-executable instructions which reside, for example, in computer-usable media of a computer system. FIG. 1 illustrates an exemplary computer system 100 used to perform the ATPG method in accordance with one embodiment of the present invention. It is appreciated that system 100 of FIG. 1 is exemplary only and that the present invention can operate within a number of different computer systems including general purpose computers systems, embedded computer systems, and stand alone layout editors or computer systems specially adapted for ATPG.

System 100 of FIG. 1 includes an address/data bus 102 for communicating information, and a central processor unit 104 coupled to bus 102 for processing information and instructions. System 100 also incudes data storage features such as a computer usable volatile memory 106, e.g. random access memory (RAM), coupled to bus 102 for storing information and instructions for central processor unit 104, computer usable non-volatile memory 108, e.g. read only memory (ROM), coupled to bus 102 for storing static information and instructions for the central processor unit 104, and a data storage unit 110 (e.g., a magnetic or optical disk and disk drive) coupled to bus 102 for storing information and instructions. A input output signal unit 112 (e.g. a modem) coupled to bus 102 is also included in system 100 of FIG. 1. System 100 of the present invention also includes an optional alphanumeric input device 114 including alphanumeric and function keys is coupled to bus 102 for communicating information and command selections to central processor unit 104. System 100 also optionally includes a cursor control device 116 coupled to bus 102 for communicating user input information and command selections to central processor unit 104. System 100 of the present embodiment also includes an optional display device 118 coupled to bus 102 for displaying information.

Optional display device 118 of FIG. 1, utilized with the present ATPG method, may be a liquid crystal device, cathode ray tube, or other display device suitable for creating graphic images and alphanumeric characters recognizable to a user. Optional cursor control device 116 allows the computer user to dynamically signal the two dimensional movement of a visible symbol (cursor) on a display screen of display device 118. Many implementations of cursor control device 116 are known in the art including a trackball, mouse, touch pad, joystick or special keys on alphanumeric input device 114 capable of signaling movement of a given direction or manner of displacement. Alternatively, it will be appreciated that a cursor can be directed and/or activated via input from alphanumeric input device 114 using special keys and key sequence commands. The present invention is also well suited to directing a cursor by other means such as, for example, voice commands. A more detailed discussion of the present ATPG method is found below.

GENERAL DESCRIPTION OF THE PRESENT AUTOMATIC TEST PATTERN GENERATION METHOD

Figure 2:
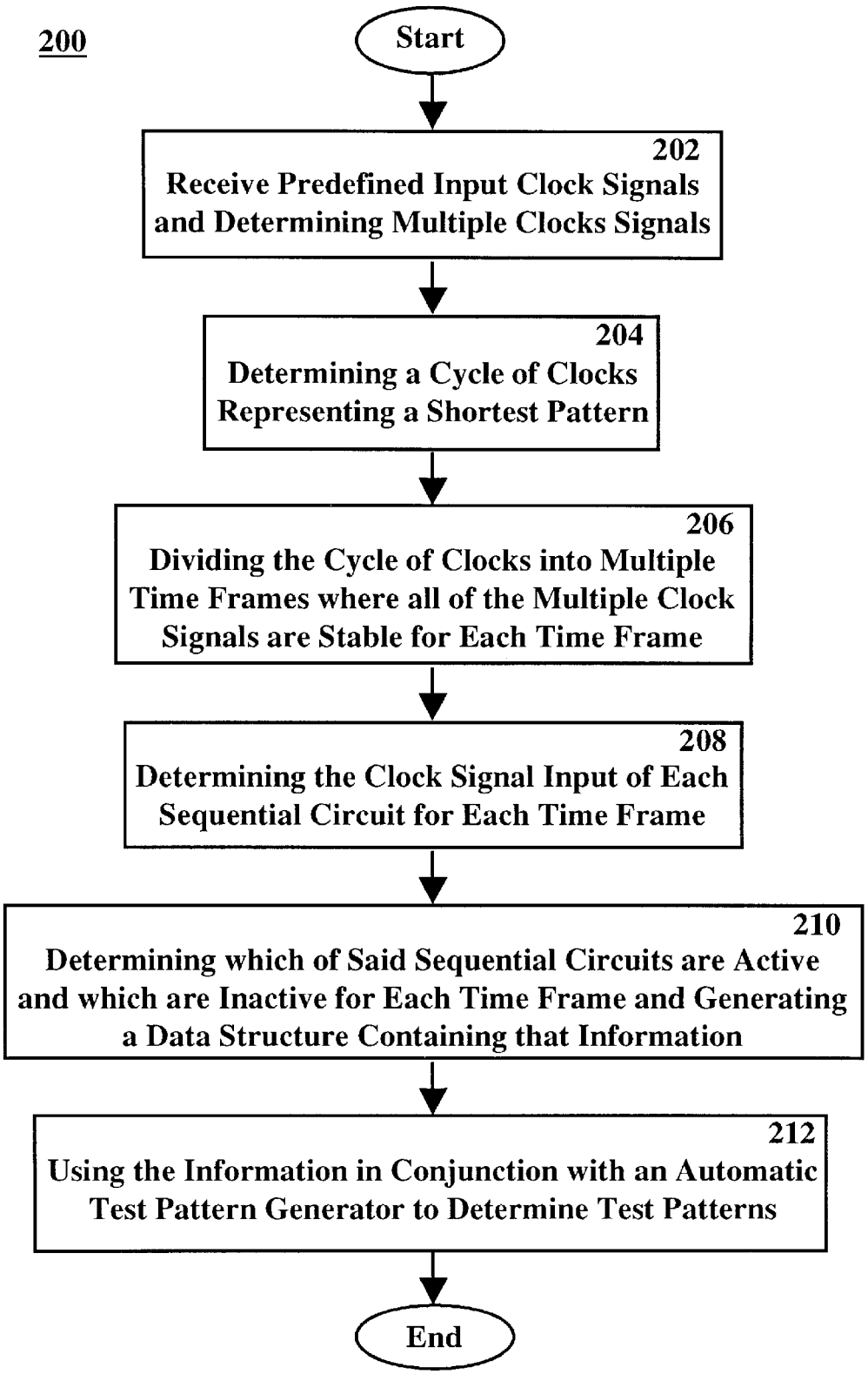
FIG. 2 is a flow chart of steps performed in accordance with one embodiment of the present claimed invention.

With reference next to FIG. 2, a flow chart 200 of steps used by the present ATPG method is shown. Flow chart 200 includes processes of the present invention which, in one embodiment, are carried out by a processor under the control of computer-readable and computer-executable instructions. The computer-readable and computer-executable instructions reside, for example, in data storage features such as computer usable volatile memory 106 and/or computer usable non-volatile memory 108 of FIG. 1. The computer-readable and computer-executable instructions are used to control, for example, the operation and functioning of central processing unit 104 of FIG. 1. The steps of FIG. 2 will be described in conjunction with FIGS. 3-6.

With reference again to FIG. 2, in step 202, the present invention receives predefined input clock signals and determines multiple clock signals therefrom. The present invention utilizes the received predefined input clock signals to determine the values of internal clock signals that are dependent on the predefined input clock signals and portions of the combinatorial logic. In the present embodiment, the multiple clock signals comprise the predefined input clock signals and the internal clock signals. Additionally, in one embodiment, the multiple clock signals are primary input clock signals.

Figure 3:
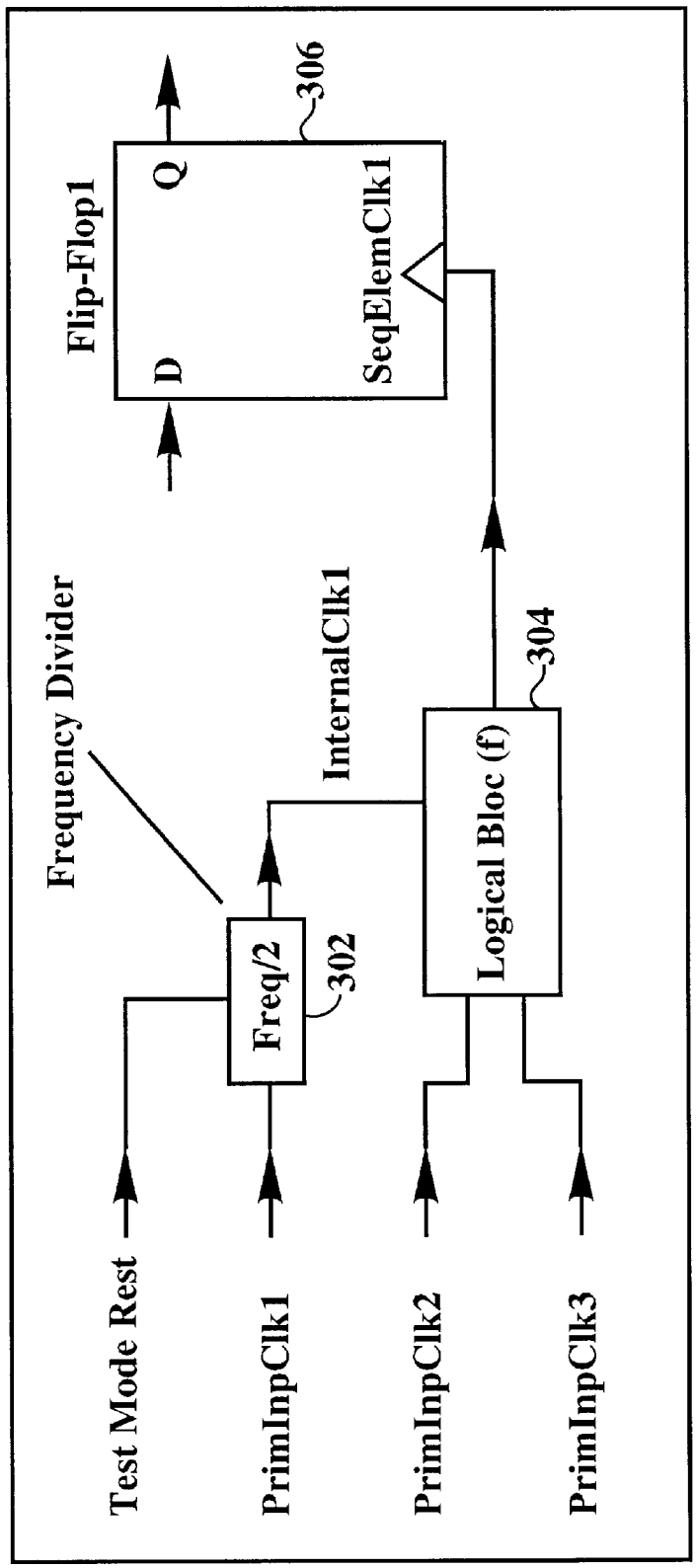
FIG. 3 is a schematic diagram of clock modeling circuitry utilized in conjunction with one embodiment of the present claimed invention.

Referring now to FIG. 3, a schematic diagram of exemplary clock modeling circuitry utilized in conjunction with step 202 of the present invention is shown. In the present embodiment, a frequency divider 302 receives a primary input clock signal 1 (PrimInpClk1). A logical simulator, of the type well known in the art, represented by logical block 304 receives an internal clock signal (InternalClk1), and primary input clock signals 2 and 3, (PrimInpClk2 and PrimInpClk3). The output from logical block 304 is then input as the clock signal (SeqElemClk1) to the sequential element typically shown as 306. In the present invention, the clock signals can be gated or dual edge.

With reference again to FIG. 2, in step 204, the invention utilizes the user defined primary input clock signal waveforms received in step 202 and determines a cycle of clocks based thereon that, when replicated, statically represents all waveforms over time.

In step 206, the cycle of clocks is divided into frames where each frame contains stable clock values. The stable clock values are input to logic simulator 304 of FIG. 3 to determine the values of each signal that clocks a sequential circuit of the netlist for each frame. In the present embodiment, the SeqElemClk1 signal is determined as follows: SeqElemClk(k, t)=f[PrimInpClk(i, t), Internal Clk (j, t)], where k indexes the sequential elements, t indexes the time, i indexes the primary input clocks, and j indexes the internal clocks.

Figure 4:
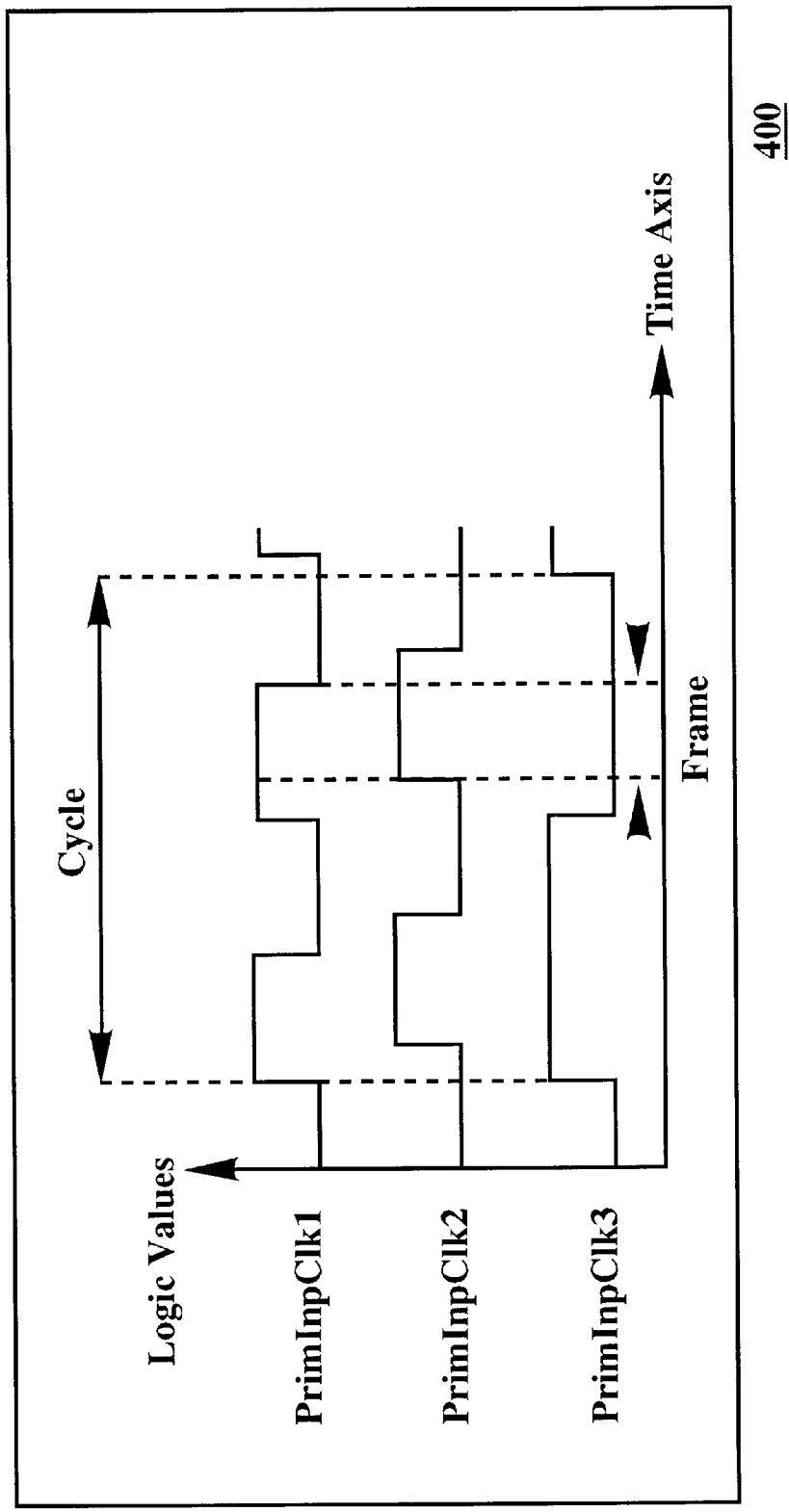
FIG. 4 is a timing diagram illustrating the determination of clock cycles and frames in accordance with one embodiment of the present claimed invention.

With reference next to FIG. 4, a timing diagram 400 illustrating a representation of clock cycles and frames determined in accordance with one embodiment of the present claimed invention is shown. As mentioned above, the cycle of clocks is divided into frames such that each frame contains only stable clock values.

Referring again to FIG. 2, in step 208 the present invention then generates a set of stable values of the multiple clock signals for each time frame. That is, the present invention uses a logic simulator to determine the clock signal input of each sequential circuit within the netlist for each time frame. More specifically, in the present embodiment, the present invention determines the values of each clock signal that clocks a sequential circuit within the netlist using a logic simulator and then supplies the logic simulator with the multiple clock signals as input.

In step 210, the present invention then utilizes the information obtained in step 208 to determine which sequential circuits are active and which are not active for any given frame. In the present embodiment, the present invention determines a first value of a clock signal that clocks the respective sequential circuit during a time frame. The present invention then determines a second value of the clock signal that clocks the respective sequential circuit during the previous time frame to the current time frame. Next, the present invention determines whether the respective sequential circuit is active during the present time frame if the first and second values are different. That is, the present invention determines whether the clock signal has transitioned/toggled between the current time frame and a previous time frame. In the present embodiment, the sequential element is determined to be active when the current time frame has a high input value and the previous time frame has a low input value.

Figure 5:
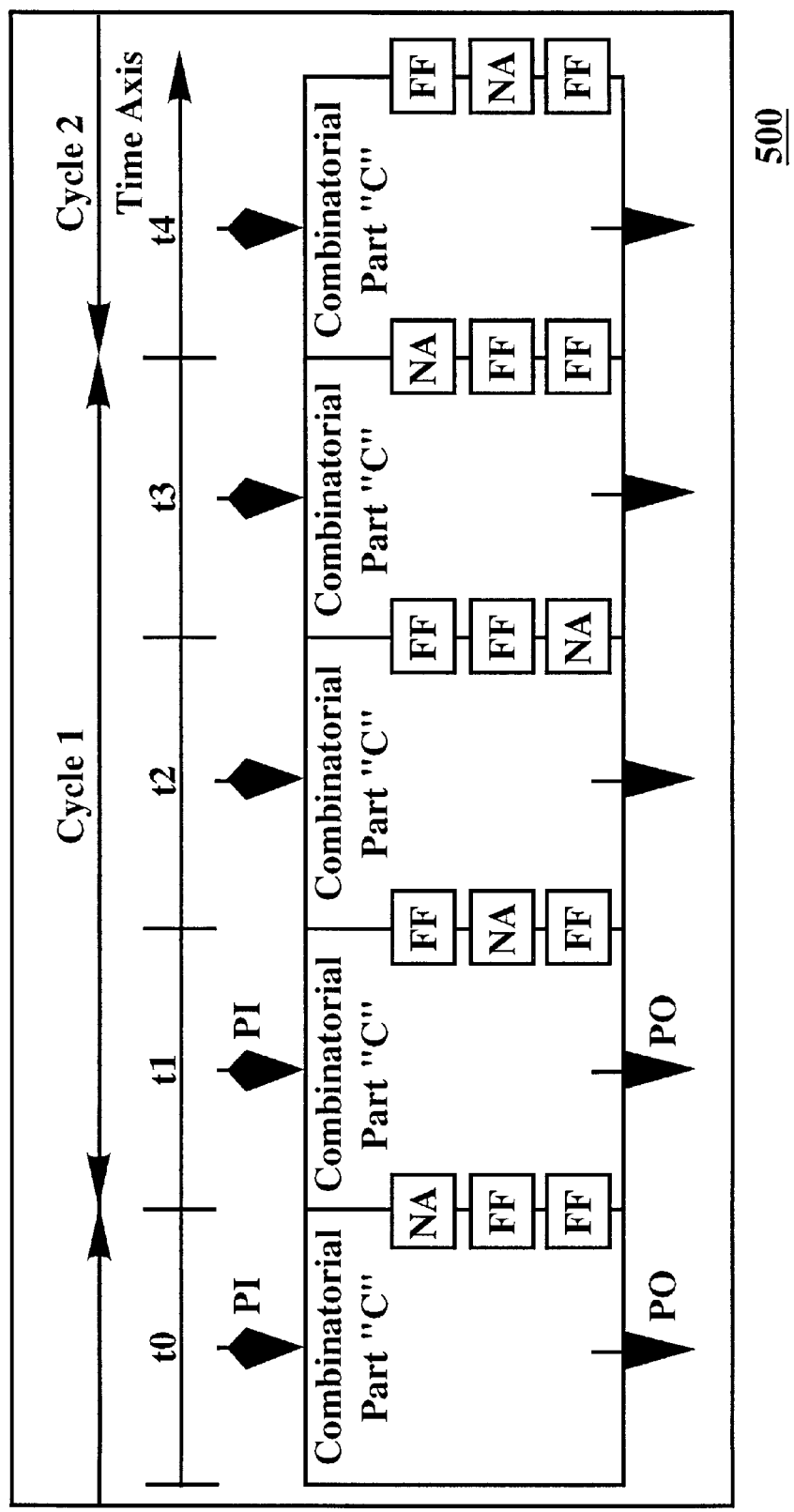
FIG. 5 is a schematic diagram illustrating active and inactive sequential elements during selected frames of various clock cycles in accordance with one embodiment of the present claimed invention.

With reference now to FIG. 5, a schematic diagram 500 illustrating active and inactive sequential elements during selected frames of various clock cycles as determined in accordance with one embodiment of the present claimed invention is shown. In FIG. 5, the active sequential elements are depicted as "FF", and the inactive sequential elements are depicted as "NA". As shown in FIG. 5, in the present embodiment, the automatic test pattern generator utilizes an iterative array representation of a sequential circuits model comprising combinatorial logic states separated by columns of modeled sequential elements for each time frame and wherein individual columns of modeled sequential elements contain subsets of active sequential elements and subsets of inactive sequential elements. By determining which sequential elements are inactive for each time frame, the present invention allows only analysis of potentially propagated faults to be limited to sequential circuit outputs only for active sequential elements of the netlist within the iterative array representation (IAR) of sequential circuits model. In so doing, the present invention efficiently prunes the search space and search time for finding test patterns that can distinguish a particular fault.

Referring again to step 208 of FIG. 2, the present embodiment also generates a data structure in a computer memory for all time frames.

Referring now to FIG. 6, a matrix-configured data structure 600 storing information is shown. Matrix-configured data structure 600 indicates whether sequential elements are active or inactive during selected frames of various clock cycles. In the present embodiment, matrix-configured data structure 600 is comprised of a set of columns 602 representing each time frame, and a set of rows 604 representing each sequential element. The information provided by matrix-configured data structure 600 is adapted to describe each sequential element in the netlist including a designation of each time frame of the cycle of clocks in which the sequential element is active or inactive. This information is adapted to be supplied to a test pattern generator. Matrix-configured data structure 600 also adapted to provides information comprising, for each time frame of the cycle of clocks, a list designating all active sequential elements of the netlist. This information is well suited to being supplied to a logic simulator.

Referring again to FIG. 2, in step 212 the present invention uses the information provided in data structure 600 in conjunction with an automatic test pattern generator, of the type well known in the art, to determine test patterns/vectors. The test patterns/vectors are then used to distinguish a particular fault within the netlist.

Thus, unlike conventional ATPG processes, test pattern determination efficiency is gained in the present invention by having, in advance, the input clock signals given by the user. In effect, the clock waveforms are given by the user and the ATPG process is then constrained to find a test sequence given a particular clock waveform. In the present embodiment, the clock waveforms can be supplied by the user in a computer system file format.

Thus, the present invention provides a method and computer system for automatically determining test patterns for a netlist having multiple clocks and sequential circuits. The present invention further provides a method and system for performing ATPG on netlists having sequential circuits and multiple clock signals that does not utilize a dynamic model of the sequential circuit. The present invention also provides a method and system for performing ATPG on netlists having sequential circuits and multiple clock signals that uses the same model for sequential circuits as is used in single clock models.

What is claimed is:

1. A computer implemented method of generating test patterns for a circuit represented by a netlist and having clock signals, sequential circuits and combinatorial logic, said computer implemented method comprising the steps of:

a) receiving predefined input clock signals and determining multiple clock signals therefrom;

b) determining a cycle of clocks based on cycles of each clock signal of said multiple clock signals, said cycle of clocks representing a shortest pattern that when replicated yields all of said multiple clock signals;

c) dividing said cycle of clocks into multiple time frames wherein all of said multiple clock signals are stable within each time frame, said step c) generating a set of stable values of said multiple clock signals for each time frame;

d) using a logic simulator, determining the clock signal input of each sequential circuit within said netlist for each time frame, said step d) using as input a set of stable values of said multiple clock signals for each time frame;

e) for each time frame, determining which of said sequential circuits are active and which of said sequential circuits are inactive in said time frame and generating a data structure in a computer memory for all time frames; and f) using an automatic test pattern generator, constrained by said data structure and said multiple clock signals, to determine said test patterns, said test patterns for distinguishing a particular fault within said netlist.

2. A computer implemented method as described in claim 1 wherein said automatic test pattern generator utilizes an iterative array representation of sequential circuits model comprising combinatorial logic states separated by columns of modeled sequential elements for each time frame and wherein individual columns of modeled sequential elements contain subsets of active sequential elements and subsets of inactive sequential elements.

3. A computer implemented method as described in claim 2 wherein step f) comprises the step of said automatic test pattern generator propagating sequential circuit inputs to sequential circuit outputs only for active sequential elements of said netlist within said iterative array representation of sequential circuits model.

4. A computer implemented method as described in claim 1 wherein said step of determining which of said sequential circuits are active and which of said sequential circuit are inactive for a time frame is performed for each respective sequential circuit according to the steps of:

determining a first value of a clock signal that clocks said respective sequential circuit during said time frame;

determining a second value of said clock signal that clocks said respective sequential circuit during the previous time frame to said time frame; and determining that said respective sequential circuit is active during said time frame if said first and second values are different.

5. A computer implemented method as described in claim 1 wherein said multiple clock signals include gated-clocks, dual-edge clocks and internal clocks.

6. A computer implemented method as described in claim 1 wherein step a) comprises the step of:

determining values of internal clock signals that are dependent on said predefined input clock signals and portions of said combinatorial logic, wherein said multiple clock signals comprise said predefined input clock signals and said internal clock signals, and wherein step d) comprises the step of:

determining values of each clock signal that clocks a sequential circuit within said netlist using said logic simulator and supplying said logic simulator with said multiple clock signals as input.

7. A computer implemented method as described in claim 1 wherein said multiple clock signals are primary input clock signals.

8. A computer implemented method as described in claim 1 wherein said data structure comprises:

a first portion comprising, for each sequential element in said netlist, a designation of each time frame of said cycle of clocks in which said sequential element is active, said first portion for supplying to said test pattern generator; and a second portion comprising, for each time frame of said cycle of clocks, a list designating all active sequential elements of said netlist, said second portion for supplying to said logic simulator.

9. A computer implemented method of generating test patterns for a circuit represented by a netlist and having clock signals, sequential circuits and combinatorial logic, said method comprising the steps of:

a) determining values of internal clock signals that are dependent on predefined input clock signals and portions of said combinatorial logic, wherein multiple clock signals comprise said predefined input clock signals and said internal clock signals;

b) determining a cycle of clocks based on cycles of each clock signal of said multiple clock signals, said cycle of clocks representing a shortest pattern that when replicated yields all of said multiple clock signals;

c) dividing said cycle of clocks into multiple time frames wherein all of said multiple clock signals are stable within each time frame, said step c) generating a set of stable values of said multiple clock signals for each time frame;

d) using a logic simulator, determining the clock signal input of each sequential circuit within said netlist for each time frame, said step d) using as input a set of stable values of said multiple clock signals for each time frame, said step d), for each respective sequential circuit, comprising the steps of:

determining a first value of a clock signal that clocks said respective sequential circuit during said time frame;

determining a second value of said clock signal that clocks said respective sequential circuit during the previous time frame to said time frame; and determining that said respective sequential circuit is active during said time frame if said first and second values are different;

e) for each time frame, determining which of said sequential circuits are active and which of said sequential circuit are inactive in said time frame and generating a data structure in a computer memory for all time frames; and f) using an automatic test pattern generator, constrained by said data structure and said multiple clock signals, to determine said test patterns, said test patterns for distinguishing a particular fault within said netlist.

10. A computer implemented method as described in claim 9 wherein said automatic test pattern generator utilizes an iterative array representation of sequential circuits model comprising combinatorial logic states separated by columns of modeled sequential elements for each time frame and wherein individual columns of modeled sequential elements contain subsets of active sequential elements and subsets of inactive sequential elements.

11. A computer implemented method as described in claim 10 wherein step f) comprises the step of said automatic test pattern generator propagating sequential circuit inputs to sequential circuit outputs only for active sequential elements of said netlist within said iterative array representation of sequential circuits model.

12. A computer implemented method as described in claim 9 wherein said multiple clock signals include gated-clocks, dual-edge clocks and internal clocks.

13. A computer implemented method as described in claim 9 wherein said data structure comprises:

a first portion comprising, for each sequential element in said netlist, a designation of each time frame of said cycle of clocks in which said sequential element is active, said first portion for supplying to said test pattern generator; and a second portion comprising, for each time frame of said cycle of clocks, a list designating all active sequential elements of said netlist, said second portion for supplying to said logic simulator.

14. In a computer system having a processor coupled to a bus, a computer readable memory unit coupled to said bus and having stored therein a computer program that when executed by said processor causes said computer system to implement a method of generating test patterns for a circuit represented by a netlist and having clock signals, sequential circuits and combinatorial logic, said method comprising the steps of:

a) receiving predefined input clock signals and determining multiple clock signals therefrom;

b) determining a cycle of clocks based on cycles of each clock signal of said multiple clock signals, said cycle of clocks representing a shortest pattern that when replicated yields all of said multiple clock signals;

c) dividing said cycle of clocks into multiple time frames wherein all of said multiple clock signals are stable within each time frame, said step c) generating a set of stable values of said multiple clock signals for each time frame;

d) using a logic simulator, determining the clock signal input of each sequential circuit within said netlist for each time frame, said step d) using as input a set of stable values of said multiple clock signals for each time frame;

e) for each time frame, determining which of said sequential circuits are active and which of said sequential circuit are inactive in said time frame and generating a data structure in said computer readable memory unit for all time frames; and f) using an automatic test pattern generator, constrained by said data structure and said multiple clock signals, to determine said test patterns, said test patterns for distinguishing a particular fault within said netlist.

15. A computer readable memory unit as described in claim 14 wherein said automatic test pattern generator utilizes an iterative array representation of sequential circuits model comprising combinatorial logic states separated by columns of modeled sequential elements for each time frame and wherein individual columns of modeled sequential elements contain subsets of active sequential elements and subsets of inactive sequential elements.

16. A computer readable memory unit as described in claim 15 wherein step f) of said method comprises the step of said automatic test pattern generator propagating sequential circuit inputs to sequential circuit outputs only for active sequential elements of said netlist within said iterative array representation of sequential circuits model.

17. A computer readable memory unit as described in claim 14 wherein said step of determining which of said sequential circuits are active and which of said sequential circuit are inactive for a time frame is performed for each respective sequential circuit according to the steps of:

determining a first value of a clock signal that clocks said respective sequential circuit during said time frame;

determining a second value of said clock signal that clocks said respective sequential circuit during the previous time frame to said time frame; and determining that said respective sequential circuit is active during said time frame if said first and second values are different.

18. A computer readable memory unit as described in claim 14 wherein said multiple clock signals include gated-clocks, dual-edge clocks and internal clocks.

19. A computer readable memory unit as described in claim 14 wherein step a) of said method comprises the step of:

determining values of internal clock signals that are dependent on said predefined input clock signals and portions of said combinatorial logic, wherein said multiple clock signals comprise said predefined input clock signals and said internal clock signals, and wherein step d) comprises the step of:

determining values of each clock signal that clocks a sequential circuit within said netlist using said logic simulator and supplying said logic simulator with said multiple clock signals as input.

20. A computer readable memory unit as described in claim 14 wherein said data structure comprises:

a first portion comprising, for each sequential element in said netlist, a designation of each time frame of said cycle of clocks in which said sequential element is active, said first portion for supplying to said test pattern generator; and a second portion comprising, for each time frame of said cycle of clocks, a list designating all active sequential elements of said netlist, said second portion for supplying to said logic simulator.

* * * * *